United States Patent
Bybell (10) Patent No.: US 10,146,698 B2
(45) Date of Patent: *Dec. 4, 2018

(54) METHOD AND APPARATUS FOR POWER REDUCTION IN A MULTI-THREADED MODE

(71) Applicant: Advanced Micro Devices, Inc., Sunnyvale, CA (US)

(72) Inventor: Anthony J. Bybell, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/850,113

(22) Filed: Dec. 21, 2017

(65) Prior Publication Data
US 2018/0113814 A1 Apr. 26, 2018

Related U.S. Application Data

(63) Continuation of application No. 15/238,920, filed on Aug. 17, 2016, now Pat. No. 9,864,700.

(51) Int. Cl.
*G06F 12/00* (2006.01)
*G06F 12/1027* (2016.01)
(Continued)

(52) U.S. Cl.
CPC ........ *G06F 12/1027* (2013.01); *G06F 1/3287* (2013.01); *G06F 12/0842* (2013.01);
(Continued)

(58) Field of Classification Search
CPC ............. G06F 12/1027; G06F 12/0864; G06F 1/3287; G06F 2212/6032; G06F 2212/657;
(Continued)

(56) References Cited

U.S. PATENT DOCUMENTS 7,467,256 B2 12/2008 Jain et al.
8,930,674 B2 1/2015 Avudaiyappan et al.
(Continued)

FOREIGN PATENT DOCUMENTS

WO 2005020067 A2 3/2005

OTHER PUBLICATIONS

ARM Limited, ARM940T Technical Reference Manual, Revision 2, Nov. 22, 2000, 230 pgs. (Available at: http://infocenter.arm.com/help/topic/com.arm.doc.ddi0144b/940T_TRM_S.pdf).

(Continued)

*Primary Examiner* — Shawn X Gu
(74) *Attorney, Agent, or Firm* — Volpe and Koenig, P.C.

(57) ABSTRACT

A method and apparatus for reducing dynamic power consumption in a multi-thread content-addressable memory (CAM) is described. The disclosed apparatus includes a first input configured to receive a first virtual address corresponding to a first thread, a second input configured to receive a second virtual address corresponding to a second thread, a register bank including a plurality of registers each configured to store a binary word mapped to one of a plurality of physical addresses, a first comparator bank including a first plurality of comparators each coupled to one of the plurality of registers in a fully-associative configuration and configured to determine whether a first match is present, and a second comparator bank including a second plurality of comparators each coupled to one of the plurality of registers in a fully-associative configuration and configured to determine whether a second match is present.

20 Claims, 6 Drawing Sheets

(51) Int. Cl.
  *G06F 1/32* (2006.01)
  *G06F 12/0864* (2016.01)
  *G11C 15/00* (2006.01)
  *H04L 12/741* (2013.01)
  *H04L 12/743* (2013.01)
  *G06F 12/0842* (2016.01)
  *G11C 5/14* (2006.01)
  *G06F 17/30* (2006.01)

(52) U.S. Cl.
  CPC ............ *G06F 12/0864* (2013.01); *G11C 5/14* (2013.01); *G11C 15/00* (2013.01); *H04L 45/745* (2013.01); *H04L 45/7457* (2013.01); *G06F 17/30982* (2013.01); *G06F 2212/1028* (2013.01); *G06F 2212/6032* (2013.04); *G06F 2212/657* (2013.01); *G06F 2212/683* (2013.01); *G11C 2207/2263* (2013.01)

(58) Field of Classification Search
  CPC ......... G06F 2212/683; G06F 17/30982; G11C 15/00; H04L 45/745; H04L 45/7457
  See application file for complete search history.

(56) References Cited

U.S. PATENT DOCUMENTS

| | | |
|---|---|---|
| 9,251,092 B2 | 2/2016 | Bybell et al. |
| 2005/0050296 A1* | 3/2005 | Kottapalli ........... G06F 12/1036 711/207 |
| 2005/0216655 A1 | 9/2005 | Rosenbluth |
| 2006/0004956 A1 | 1/2006 | Madajczak |
| 2006/0136659 A1 | 6/2006 | Jain et al. |
| 2007/0296729 A1 | 12/2007 | Du et al. |
| 2008/0133885 A1 | 6/2008 | Glew |
| 2009/0089553 A1 | 4/2009 | Bybell |
| 2009/0089817 A1 | 4/2009 | Bybell |
| 2012/0218822 A1 | 8/2012 | Roohparvar |
| 2013/0339659 A1 | 12/2013 | Bybell et al. |
| 2014/0281353 A1 | 9/2014 | Bybell et al. |

OTHER PUBLICATIONS

Pagiamtzis, Kostas et al., "Content-Addressable Memory (CAM) Circuits and Architectures: A Tutorial and Survey", IEEE Journal of Sold-State Circuits, Mar. 2006, pp. 712-727, vol. 41, Issue 3, IEEE, USA.

* cited by examiner

FIG. 1

PRIOR ART

METHOD AND APPARATUS FOR POWER REDUCTION IN A MULTI-THREADED MODE

CROSS REFERENCE TO RELATED APPLICATION

This application is a continuation of U.S. patent application Ser. No. 15/238,920, filed Aug. 17, 2016, which is incorporated by reference as if fully set forth.

BACKGROUND

Virtual memory allows computing systems to better manage memory than if the computing system was limited to managing the actual memory accessible by the computing system. For example, virtual addressing as a memory mapping mechanism allows the computing system to allocate non-contiguous regions to a particular application, while giving the application the appearance of being allocated one contiguous region of memory. Additionally, virtual memory functionality allows a computing system to allocate more memory than is actually available in the computing system to applications. Whenever an application references a memory address (e.g., a virtual address (VA)) on a system that implements virtual memory, the address is translated into a physical address (PA) that refers to the actual memory location. Because applications frequently interact with memory, inefficiency and inflexibility within the virtual memory system can cause performance degradation.

Using virtual addressing, processors can access memory, using physical addresses that are generated from virtual address to physical address translation. To accelerate the virtual address to physical address translation process, processors can use Translation Lookaside Buffers (TLB), which are content addressable memory (CAM) plus random access memory (RAM) structures that cache virtual address to physical address translations.

TLBs are, therefore, hardware structures that are used in computing systems to cache virtual-to-physical address translations and operating system (OS)-page-granularity metadata (e.g., read/write permissions). The TLB is important to performance scalability in computing systems because the TLB is looked up on every memory access, it is in the critical path, and each processor core or accelerator has its own TLB.

Microprocessors implement multiple threads in order to cut down on cell count to make it appear that more processors are present in a system by taking advantage of what could be "dead" cycles in a microprocessor. In many places in the microprocessor, pipe states are tagged with a thread identifier (ID) and existing resources in the processor are shared across threads. This sharing of resources cuts down on cell count but can be expensive with respect to power, especially if there is a high amount of circuit activity in changing from one thread to the other.

Figure 1:
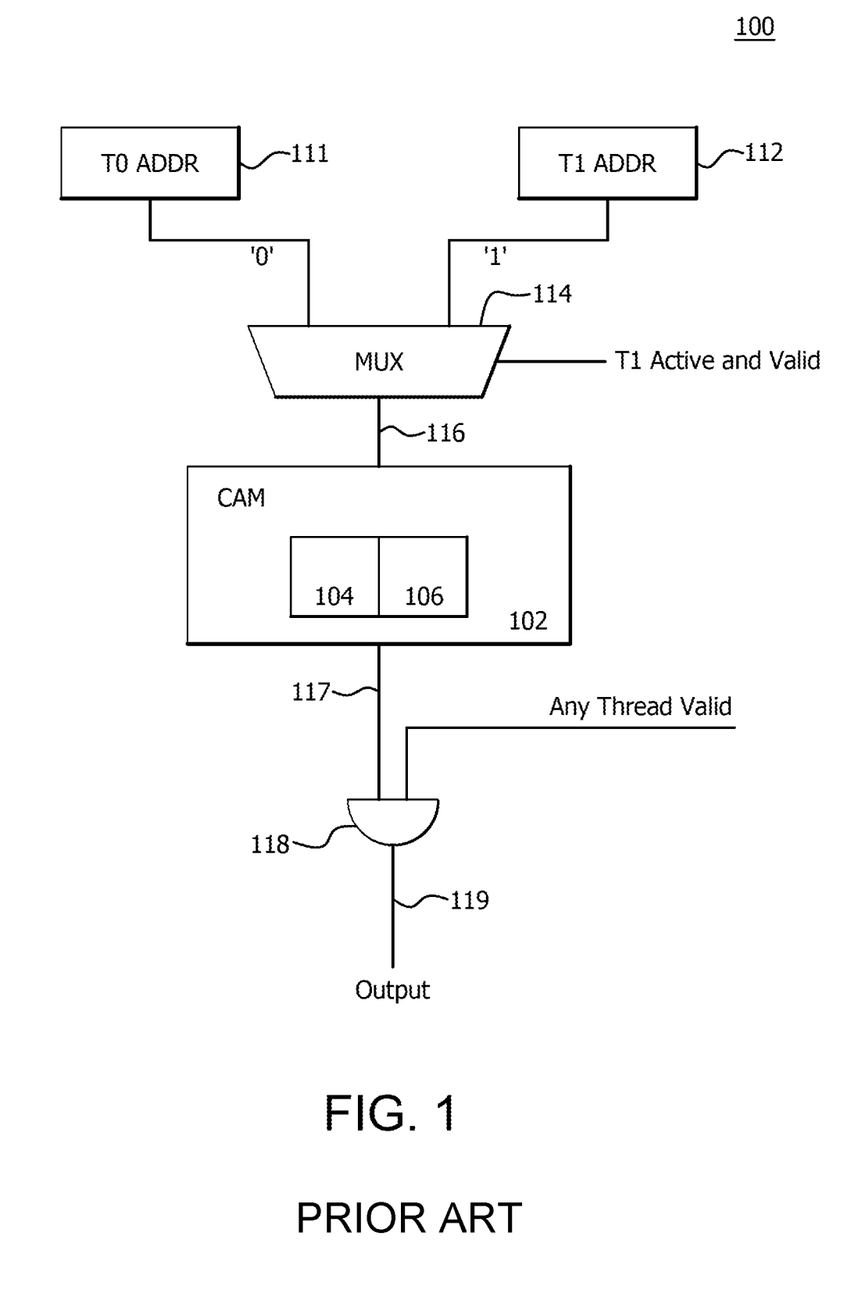
FIG. 1 is a block diagram of a multi-thread system implementing a conventional content-addressable memory (CAM)

For example, FIG. 1 shows a block diagram of multi-thread system 100 implementing a CAM 102. The CAM 102 includes a single bank of registers 104 coupled and corresponding to a single bank of comparators 106 for performing write and lookup operations. The multi-thread system 100 further includes a thread 0 (T0) and a thread 1 (T1), which each include their own search data registers 111 and 112 that store an address or tag to input to the CAM 102. The stored tag for each thread is input to the multiplexer 114, which selects one of the tags for input to the CAM 102 based on a "T1 active" bit. An input address 116 (i.e., the selected tag) is then provided to the CAM 102. Upon performing a lookup operation using the input address 116, the CAM 102 outputs a match result 117 (e.g., "hit" or "miss") based on the CAM entries stored in the bank of registers 104. Lastly, the match result 117 is ANDed with an "any thread valid" bit by an AND gate 118, which ensures that one of the threads (e.g., thread 0 or 1) is valid before outputting the match result 117 as the output 119.

In a typical operation of the multi-thread system 100, the input address 116 is cycled back and forth between thread 0 and thread 1. Since each thread shares the same bank of comparators 106, toggling can occur in the configuration of the bank of comparators 106 on every cycle depending on the address contents provided by the search data registers 111 and 112. A toggling of an input to a component (e.g., XOR, XNOR, OR or AND gate depending on implementation) of a comparator consumes power. Thus, when a larger number of comparators, or components thereof, are toggled, a thrashing of state occurs, resulting in an increase in dynamic power consumption. This can particularly occur when a large number of bits of an input address from one thread are different from bits of an input address from a second thread due to the threads being completely independent. This power consumption can be costly if the toggling occurs cycle to cycle. Thus, there exists the need to reduce power consumption in TLB CAMs implemented in a multi-threaded configuration.

BRIEF DESCRIPTION OF THE DRAWINGS

A more detailed understanding can be had from the following description, given by way of example in conjunction with the accompanying drawings wherein.

DETAILED DESCRIPTION

Figure 2:
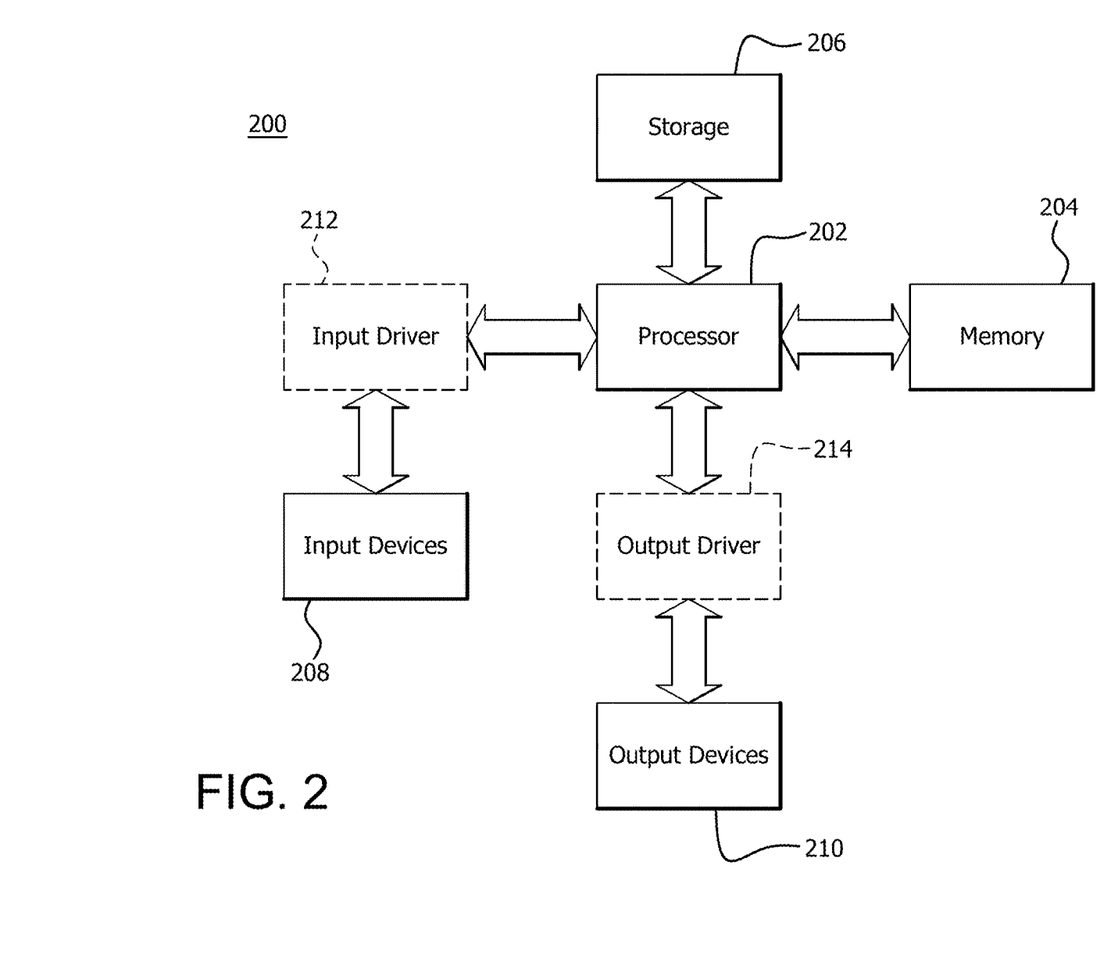
FIG. 2 is a block diagram of an example device in which one or more disclosed embodiments can be implemented.

FIG. 2 is a block diagram of an example device 200 in which one or more disclosed embodiments can be implemented. The device 200 can include, for example, a computer, a gaming device, a handheld device, a set-top box, a television, a mobile phone, or a tablet computer. The device 200 includes a processor 202, a memory 204, a storage 206, one or more input devices 208, and one or more output devices 210. The device 200 can also optionally include an input driver 212 and an output driver 214. It is understood that the device 200 can include additional components not shown in FIG. 2.

The processor 202 can include a central processing unit (CPU), a graphics processing unit (GPU), a CPU and GPU located on the same die, or one or more processor cores, wherein each processor core can be a CPU or a GPU. The memory 204 can be located on the same die as the processor 202, or can be located separately from the processor 202. The processor 202 can implement a multithreaded process using a translation lookaside buffer (TLB) content-addressable memory (CAM) in which the processor 202 switches execution resources between threads, resulting in concurrent execution. In the same multithreaded process in a shared-memory multiprocessor environment, each thread in the process can run on a separate processor at the same time, resulting in parallel execution.

The memory 204 can include a volatile or non-volatile memory, for example, random access memory (RAM), dynamic RAM, or a cache.

The storage 206 can include a fixed or removable storage, for example, a hard disk drive, a solid state drive, an optical disk, or a flash drive. The input devices 208 can include a keyboard, a keypad, a touch screen, a touch pad, a detector, a microphone, an accelerometer, a gyroscope, a biometric scanner, or a network connection (e.g., a wireless local area network card for transmission and/or reception of wireless IEEE 802 signals). The output devices 210 can include a display, a speaker, a printer, a haptic feedback device, one or more lights, an antenna, or a network connection (e.g., a wireless local area network card for transmission and/or reception of wireless IEEE 802 signals).

The input driver 212 communicates with the processor 202 and the input devices 208, and permits the processor 202 to receive input from the input devices 208. The output driver 214 communicates with the processor 202 and the output devices 210, and permits the processor 202 to send output to the output devices 210. It is noted that the input driver 212 and the output driver 214 are optional components, and that the device 200 will operate in the same manner if the input driver 212 and the output driver 214 are not present.

It will be understood that the terms "virtual address", "input address", "search address", "input search data" and "tag" are used interchangeably, unless specifically noted otherwise, and that one term can replace or be combined with another term in one or more aspects. As used herein, these terms refer to any binary lookup word being searched by the CAM, and can include a page size, a thread ID (if applicable) and a valid yes/no bit.

A system memory, as described herein, is managed by an operating system, and is allocated to different software applications as needed. The different software applications can run in one or more partitions, and the one or more partitions can run different operating systems (OSs). As noted above, virtual memory techniques can be used in such a computer system to share the physical memory of the computing system among many processes and applications. The software applications therefore deal with effective addresses in a virtual memory space, which allow the applications carry out one or more processes (e.g., to read, write, and/or execute) when required, without being concerned with the actual physical memory locations where the operations are taking place. The applications rely on the operating system that underlies each application to perform the mapping from the effective address used by the application to a physical address in the computer memory. Address translation is the mechanism by which effective addresses that reference virtual memory are translated into real memory addresses. Address translation is a complex procedure that, if not implemented well, can end up on the critical path that determines the clock cycle of the processor.

With a multi-threaded processor, multiple threads of execution exist within the context of each process. The threads of a particular process are executed in a manner in which the processor quickly switches between different threads such that it appears that threads are being simultaneously executed. A simple type of multi-threading is where one thread runs until an event, such as a cache-miss that has to access off-chip memory, which might create a long latency. Rather than waiting, the processor switches to another thread that is ready to run. When the data for the previous thread arrives, the previous thread is placed back on the list of ready-to-run threads. In another type of multi-threading, the processor switches threads every CPU cycle.

Each process is allocated resources, such as a processor, registers, and the like, by the operating system, and such resources are allocated to the process' threads such that each thread "owns" its own resources, which are used when a thread is employed to execute an instruction. When a process is created, it is stored in main memory. Once the kernel assigns the process to a processor, the process is loaded into the processor and the processor executes the thread's instructions using its resources.

A thread arbiter and/or thread priority determines which thread of execution to use to execute an instruction, and a thread identifier (ID) is associated with and follows the instruction through its various states of execution. The instruction is executed using the resources, such as the registers, of the thread that corresponds to the thread ID. When processing multiple threads, the thread arbiter or thread priority determines the next thread to employ, and a thread ID of the next thread is associated with and follows the next instruction through its various states of execution. Likewise, the instruction is executed using the resources of the thread that corresponds to the thread ID of the next thread.

A TLB is a cache that memory management hardware uses to improve virtual address translation speed. A TLB has a fixed number of slots that contain address translation data (entries), which map virtual memory addresses to physical memory addresses. TLBs are content-addressable memory, in which the search key is the virtual memory address and the search result is a physical memory address. The TLBs are a single memory cache, or the TLBs are alternatively organized in a hierarchy as is known in the art. Regardless of how the TLBs are realized, if the requested virtual address is present in the TLB (i.e., "a TLB hit"), the lookup is considered successful and the search yields a match quickly and the physical memory address is returned for accessing memory. If the requested address is not in the TLB (i.e., "a TLB miss"), the translation proceeds by looking through the page table in a process commonly referred to as a "page walk" or "page table walk". After the physical memory address is determined, the virtual memory address to physical memory address mapping is loaded in the respective TLB (that is, depending upon which processor type (CPU or accelerator) requested the address mapping) to map the faulting virtual address to the correct physical address, and the program is resumed.

As with caches, separate TLBs for the instruction and data streams have been provided on many modern processors. An Instruction Translation Lookaside Buffer (ITLB) only handles instructions addresses. TLBs can have multiple levels (e.g., L1, L2, etc.). For example, a small "L1" TLB (fully-associative) that is extremely fast, and a larger "L2" TLB (set-associative) that is somewhat slower. When ITLBs and data TLBs (DTLBs) are used, a CPU can have three or four TLBs (e.g., ITLB1, DTLB1, TLB2). Since the L1TLB is usually a small and fully-associative cache, storage accesses such as loads, stores, and instruction fetches can access the L1TLB at all page sizes in the same clock cycle. However, an L2TLB, because of its relatively large size, may not be a fully-associative structure. As a result, an L2LTB may not be accessed (e.g., searched) across all entries in a single clock cycle due to, for example, the need to access RAM arrays.

Each cache of an L1TLB comprises at least one fully-associative $2^n$ byte segment that supports single-cycle reads, and either one or two-cycle writes depending on the sequentially of the access. Each cache segment consists of, for example, 64 CAM rows that each select one of 64 RAM lines. During an L1TLB access, an input address is compared with the 64 tags in the CAM. If a match occurs (a "hit"), a matched line of the CAM is enabled and the data can be accessed. If none of the tags match (a "miss"), then a higher-level TLB or external memory is accessed. If a storage access from a cacheable memory region misses, new data is loaded into one of the 64 row lines of the $2^n$ byte segment. It will be appreciated that the number of 64 CAM rows and RAM lines is for illustration only and the number is not meant to be limiting.

As noted above, a TLB includes a CAM to compare input search data against a table of stored data and return the address of the matching data. A CAM is a special type of computer memory used in certain very-high-speed searching applications. It compares input search data (i.e., a tag) against a table of stored data, and returns the address of the matching data (or in the case of associative memory, the matching data). Thus, CAMs are hardware search engines that are much faster than algorithmic approaches for search-intensive applications. CAMs are composed of conventional semiconductor memory (e.g., static RAM (SRAM)) with added comparison circuitry that enable a search operation to complete in a single clock cycle.

A binary CAM is the simplest type of CAM which uses data search words consisting entirely of 1s and 0s. A ternary CAM (TCAM) allows a third matching state of "X" or "don't care" for one or more bits in the stored dataword, thus adding flexibility to the search. For example, a ternary CAM might have a stored word of "10XX0" which will match any of the four search words "10000", "10010", "10100", or "10110". The added search flexibility comes at an additional cost over the binary CAM as the internal memory cell must now encode three possible states instead of the two of the binary CAM. This additional state is typically implemented by adding a mask bit ("care" or "don't care" bit) to every memory cell.

One of more of the aspects described above are implemented in the additional examples described below.

According to an example, a multi-thread CAM device is provided. The CAM device includes a first input configured to receive a first virtual address corresponding to a first thread, a second input configured to receive a second virtual address corresponding to a second thread, a register bank including a plurality of registers each configured to store a binary word mapped to one of a plurality of physical addresses, a first comparator bank including a first plurality of comparators each coupled to one of the plurality of registers in a fully-associative configuration, and a second comparator bank including a second plurality of comparators each coupled to one of the plurality of registers in the fully-associative configuration.

In particular, each of the first plurality of comparators is configured to compare the first virtual address to a binary word stored in a register associated therewith for determining whether a first match is present, and the first comparator bank is configured to output first comparison results of the first plurality of comparators. Similarly, each of the second plurality of comparators is configured to compare the second virtual address to the binary word stored in a register associated therewith for determining whether a second match is present, and the second comparator bank is configured to output second comparison results of the second plurality of comparators.

In addition, each of the first plurality of comparators maintain a first input state corresponding to a previous first virtual address input to the first comparator bank on a condition that the first thread is inactive or invalid, and each of the second plurality of comparators maintain a second input state corresponding to a previous second virtual address input to the second comparator bank on a condition that the second thread is inactive or invalid.

According to another example, a multi-thread CAM method is provided. The method includes receiving, by a first comparator bank, a first virtual address corresponding to a first thread, and receiving, by a second comparator bank, a second virtual address corresponding to a second thread. The first comparator bank includes a first plurality of comparators each coupled to one of a plurality of registers of a register bank in a fully-associative configuration, and the second comparator bank includes a second plurality of comparators each coupled to one of the plurality of registers of the register bank in the fully-associative configuration.

The method further includes comparing, by each of the first plurality of comparators, the first virtual address to a binary word stored in a register associated therewith for determining whether a first match is present, maintaining, by each of the first plurality of comparators, a first input state corresponding to a previous first virtual address input to the first comparator bank on a condition that the first thread is inactive or invalid, and outputting, by the first comparator bank, first comparison results from the first plurality of comparators.

The method further includes comparing, by each of the second plurality of comparators, the second virtual address to the binary word stored in a register associated therewith for determining whether a second match is present, maintaining, by each of the second plurality of comparators, a second input state corresponding to a previous second virtual address input to the second comparator bank on a condition that the second thread is inactive or invalid, and outputting, by the second comparator bank, second comparison results from the second plurality of comparators.

Figure 3:
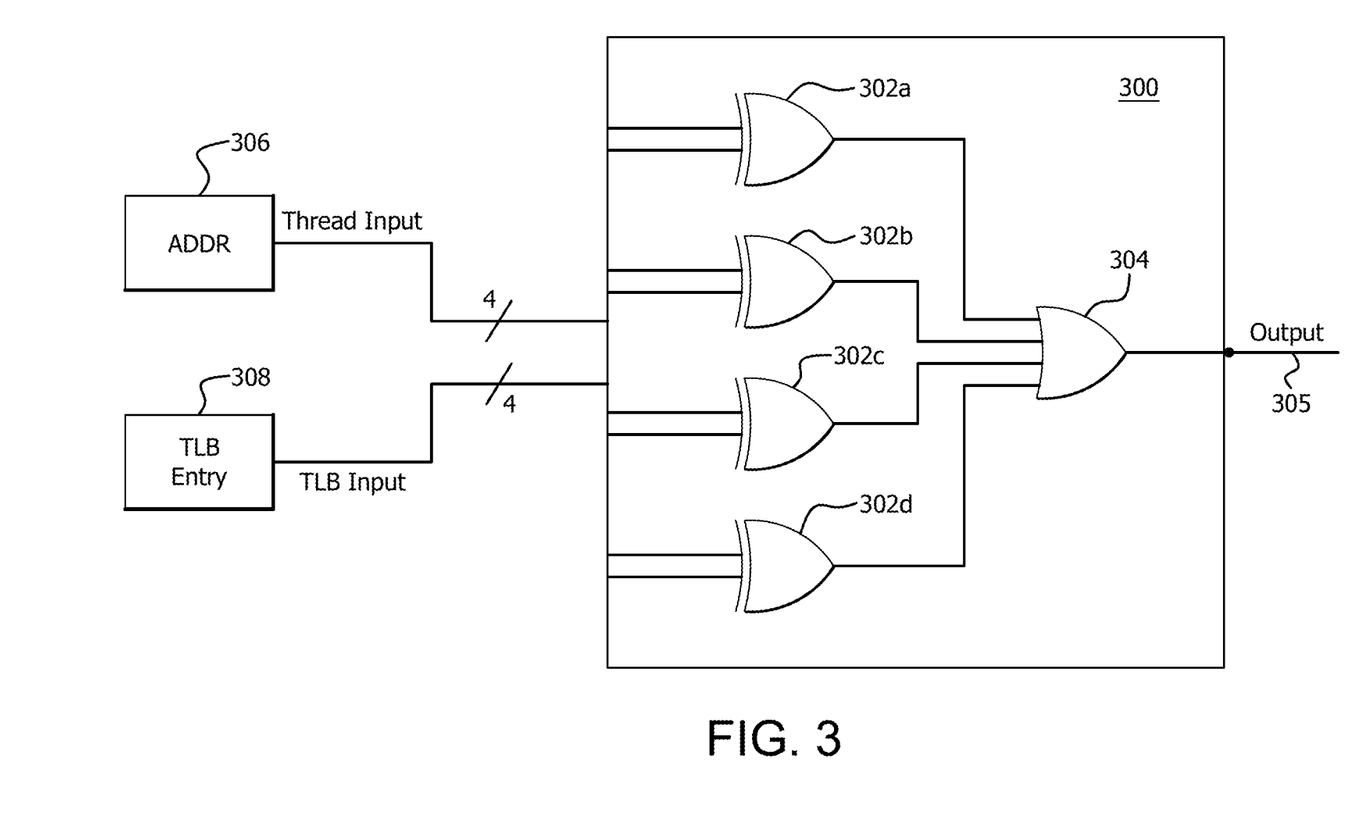
FIG. 3 shows a schematic diagram of a multi-bit logic comparator implemented in a TLB CAM according to one or more embodiments.

FIG. 3 shows a schematic diagram of a multi-bit logic comparator 300 implemented in a CAM according to one or more embodiments. The comparator 300 compares two binary words and indicates if they are equal. In this example, the comparator 300 is a 4-bit equality comparator that includes four parallel XOR gates 302a, 302b, 302c and 302d and an OR gate 304. The comparator 300 receives a 4-bit binary word ADDR (e.g., an input address or tag) provided by an address register 306 to be compared with a binary word stored in a TLB register 308 corresponding to a TLB entry.

The address register 306 is a storage unit (e.g., a search data register or load store unit) corresponding to one of the threads (e.g., thread 0 or thread 1) in a multi-thread implementation. Accordingly, multiple address registers 306 are present for a multi-thread implementation.

Each XOR gate 302a, 302b, 302c and 302d compares a single corresponding bit of the two words (ADDR and TLB entry) and outputs a 0 if the bits match. The outputs of the XOR gates 302a, 302b, 302c and 302d are then combined in the OR gate 304, the output 305 of which will be 0 (a "hit"), only when all the XOR gates 302*a*, 302*b*, 302*c* and 302*d* indicate matched inputs. Accordingly, output 305, which is inverted to be a 1 (based on implementation design), is one matchline of the CAM that indicates whether there is a hit or not for that comparator.

It will be appreciated that other types of logic components can be used to implement a multi-bit logic comparator. For example, a multi-bit logic comparator alternatively includes parallel XNOR gates that receive the binary words and an AND gate that outputs a 1 (a "hit") if all bits match.

Each time an input state to one of the components (e.g., XOR gate or OR gate) changes (e.g., 0 to 1 or 1 to 0), power is consumed by the component and, ultimately, by the comparator 300. The power consumption can be costly when a larger number of comparators, or components thereof, change states. This can occur when a large number of bits of an input address or tag from one thread are different from bits of an input address or tag from a second thread, which can change cycle to cycle. Therefore, the power consumption should be minimized for each thread.

Figure 4:
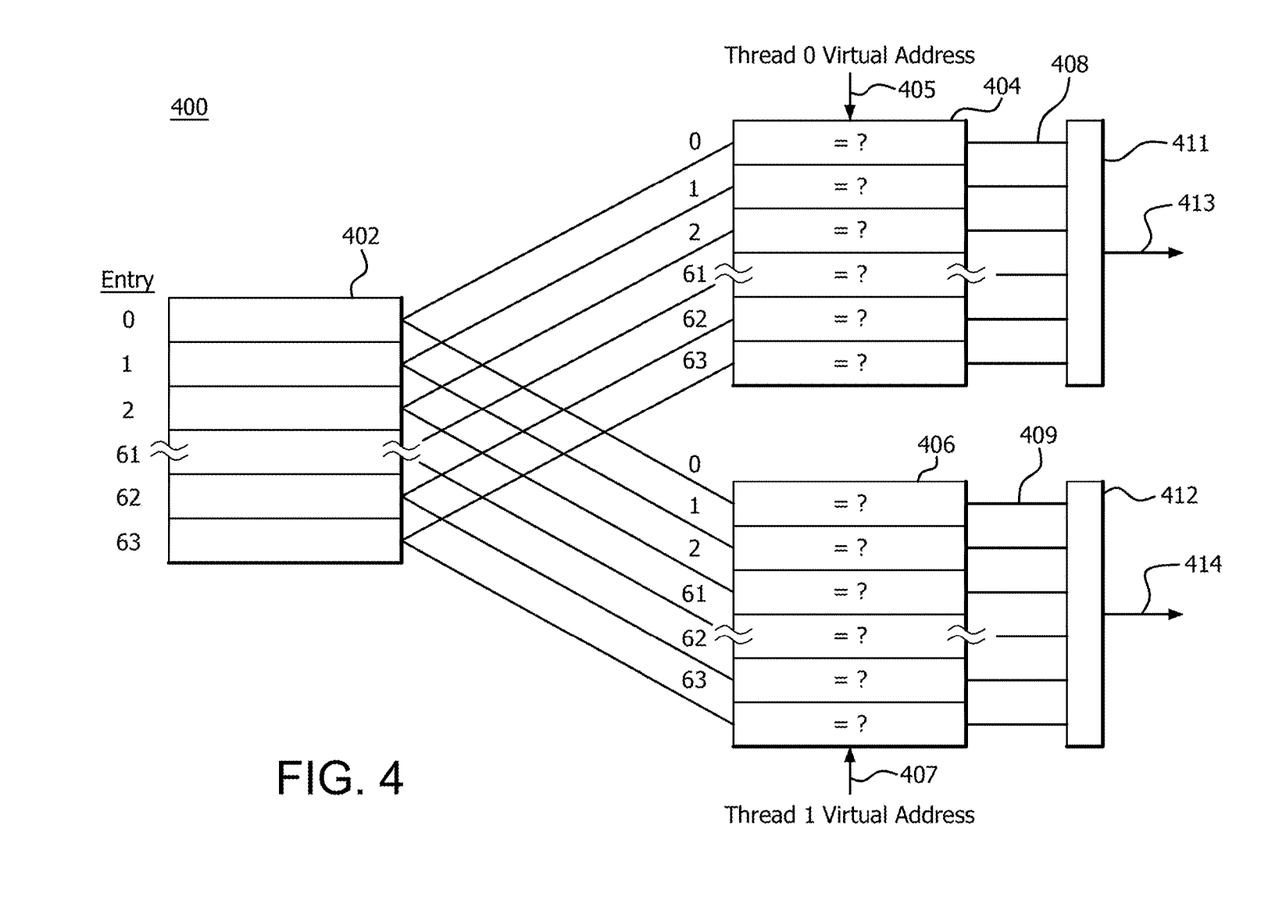
FIG. 4 is a block diagram of a multithread TLB CAM according to one or more embodiments.

FIG. 4 is a block diagram of a TLB CAM structure 400 having redundant (e.g., identical) sets of comparators for each thread of a multi-thread processor. The TLB CAM structure 400 is implemented by a processor (e.g., processor 202) in a multi-threaded environment. The processor uses one or more of the threads of execution when executing an instruction and the TLB CAM structure is implemented as an L1ITLB. For instance, the processor can be run in single thread mode in which only one of the N threads is active. In another instance, the processor can be run in multi-thread mode in which two to N threads are active. Active threads use their respective resources as well as the resources of inactive threads when executing an instruction.

The TLB CAM structure 400 includes a set of registers 402 and a set of comparators 404, 406 for each thread coupled to the set of registers 402. As used herein, a set of registers is referred to as a "bank of registers" or "register bank", and a set of comparators is referred to as a "bank of comparators" or "comparator bank".

A register bank 402 is a RAM or other memory logic that is a TLB linear virtual address storage unit. The register bank 402 includes, for example, 64 registers or storage units, which can also be referred to as slots or CAM rows. Each register contains address translation data (i.e., a TLB entry) that maps to a physical memory address.

The TLB CAM structure 400 further includes two comparator banks 404 and 406 that share, and are fully-associative with, the register bank 402. That is, each register in the register bank 402 corresponds, on a one-to-one basis, to a comparator of comparator bank 404 and corresponds, on a one-to-one basis, to a comparator of comparator bank 406. Each comparator bank 404 and 406 includes an input (e.g., thread 0 input 405 and thread 1 input 407) for receiving a virtual address from an address register of a thread.

Each comparator bank 404 and 406 includes, for example, 64 comparators (e.g., comparators 300). Each TLB entry stored in register bank 402 is compared by an associated comparator in comparator bank 404 or 406 (depending on which thread is active) with a virtual address input by thread 0 or thread 1 (depending on which thread is active). Matchlines 408 and 409 indicate whether or not a match is present in one of the corresponding comparator numbers, and the matchlines 408 and 409 are respectively coupled to a logic unit 411 and 412 (e.g., an OR or a NOR gate depending on implementation). Logic units 411 and 412 output a summary hit indication 413 and 414, respectively, that indicates whether or not one of its inputs from the matchlines 408 and 409 indicates a match or a hit.

Figure 5:
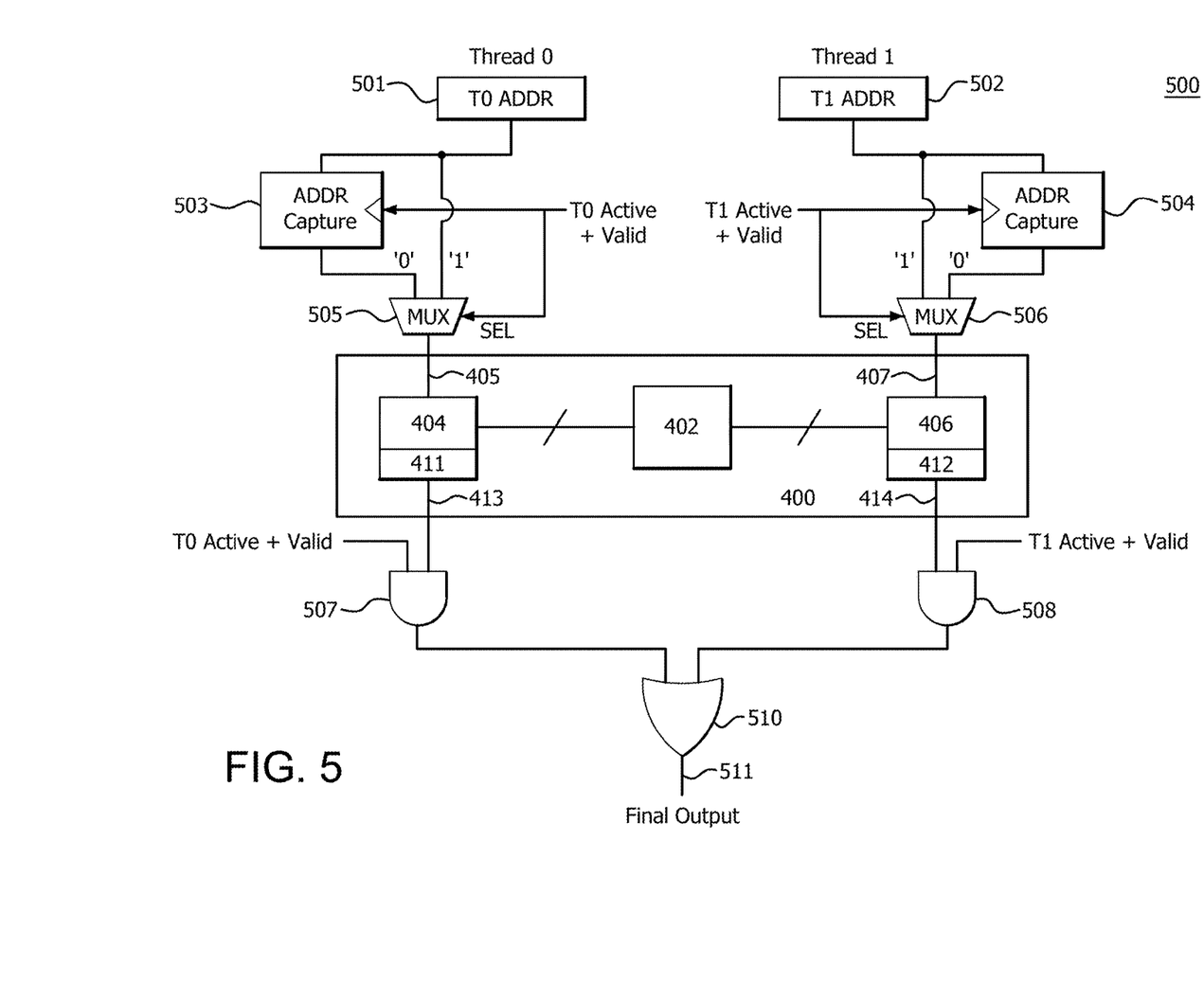
FIG. 5 is a block diagram of a multi-thread processor implementing the TLB CAM of FIG. 4 according to one or more embodiments.

FIG. 5 is a block diagram of a multi-thread processor 500 that implements the TLB CAM structure 400 of FIG. 4. While two threads are shown, it will be understood that the multi-thread processor 500 can implement more than two threads so long as there is a redundant comparator bank for each thread and the comparator banks share a single register bank, as described herein. Furthermore, the CAM implementations shown in FIGS. 3-5 are merely examples and a CAM can feature a wide variety of different configurations and variations. For example, the number of CAM entries can be varied by altering the number of CAM rows. Additionally, length of the binary words may be varied (e.g., the tag length can be varied by using a different number of RAM blocks, using RAM blocks with a different address space and/or using multi-bit comparators with a different number of parallel gates).

Many other variations are possible, including the type of logic components used for performing a binary word comparison, outputting a match hit, outputting a summary hit indication and outputting a final output result, which will be readily apparent in view of the figures. Furthermore, other variations are possible with respect to memory structures, address load and capture circuitry and logic, and input selection circuitry and logic, etc., that are described herein, which will also be readily apparent in view of the figures.

According to FIG. 5, thread 0 and thread 1 in the TLB CAM (e.g., L1ITLB CAM) each contain their own comparator banks. By doing so, this reduces thrashing of comparator states during simultaneous multithread (SMT) operation when an input address has large number of bits changing from cycle to cycle due to the threads being completely independent. Thus, instead of each thread 0 and 1 sharing a comparator bank, there is a dedicated comparator bank per-thread and the input address to each comparator bank retains its previous value (e.g., via a capture register for each thread) for when a thread is not selected. In this manner, the comparator bank for each thread only needs to change state when a thread moves from one page in memory to another, consuming less power. Thus, dynamic power consumption is reduced.

Thread 0 includes an address register 501, an address capture circuit 503 (e.g., address capture flip-flop), a multiplexer 505 connected to an input 405 of comparator bank 404, and an AND gate 507 connected to the summary hit indication 413. Thread 1 includes an address register 502, an address capture circuit 504 (e.g., address capture flip-flop), a multiplexer 506 connected to an input 407 of comparator bank 406, and an AND gate 508 connected to the summary hit indication 414. The outputs of the AND gates 507 and 508 are provided to the inputs of OR gate 510, and the OR gate 510 outputs the final output 511, which indicates a "hit" or "miss." As described above in FIG. 4, comparator banks 404 and 406 are coupled to register bank 402 in a fully associative manner.

Virtual addresses are loaded into and output from the address registers 501 and 502 simultaneously or at different times. The virtual addresses are output from the address registers 501 and 502 and are captured by the address capture circuits 503 and 504 such that the input to the respective comparator bank 404 and 406 is maintained at its previous value when a thread (i.e., thread 0 or 1) is not selected. Thus, the input state for the respective comparator bank 404 and 406 is maintained at its previous value when a thread is not active and/or valid, as indicated by a corresponding active and valid input (e.g., a T0 active and valid input or a T1 active and valid input).

The corresponding active and valid input, as described below, is a single bit, but is not limited thereto. Alternatively, a corresponding active and valid input is represented by two individual bits, one bit representing an active status of a thread and the other bit representing the validity status of the thread, that are provided as two separate inputs.

Accordingly, when the T0 active and valid input is 0, thread 0 is inactive and the virtual address stored in the address capture circuit 503 is selected by the multiplexer 505 and input to the comparator bank 404. On the other hand, when the T0 active and valid input is 1, the virtual address stored in the address register 501 is selected by the multiplexer 505 and input to the comparator bank 404. The comparator bank 404 then performs a comparison for each TLB entry provided by the register bank 402 based on the virtual address input by the multiplexer 505. Finally, a summary hit indication 413 is output and fed into the AND gate 507. The AND gate 507 ensures that thread 0 is active and valid, via the T0 active and valid input, before outputting any hit result. Thus, even if there is a hit indicated by the summary hit indication 413, the output of the AND gate 507 will be 0 (i.e., miss) if thread 0 is not active/valid. Only when there is a hit indicated by the summary hit indication 413 and thread 0 is active/valid (as indicated by the T0 active and valid input) will the AND gate 507 output a hit indication.

Similarly, when the T1 active and valid input is 0, thread 1 is inactive and the virtual address stored in the address capture circuit 504 is selected by the multiplexer 506 and input to the comparator bank 406. On the other hand, when the T1 active and valid input is 1, the virtual address stored in the address register 502 is selected by the multiplexer 506 and input to the comparator bank 406. The comparator bank 406 then performs a comparison for each TLB entry provided by the register bank 402 based on the virtual address input by the multiplexer 506. Finally, a summary hit indication 414 is output and fed into the AND gate 508. The AND gate 508 ensures that thread 1 is active and valid, via the T1 active and valid input, before outputting any hit result. Thus, even if there is a hit indicated by the summary hit indication 414, the output of the AND gate 508 will be 0 (i.e., miss) if thread 1 is not active/valid. Only when there is a hit indicated by the summary hit indication 414 and thread 1 is active/valid (as indicated by the T1 active and valid input) will the AND gate 508 output a hit indication.

The AND gates 507 and 508 each output their result to the OR gate 510, and the OR gate 510 outputs the final output 511 (i.e., hit or miss) based on whether there is an active/valid hit indicated by either AND gate 507 or AND gate 508. It will be further appreciated that the AND gates 507 and 508 and the OR gate 510 can be incorporated into the TLB CAM structure 400 or external thereto.

Figure 6:
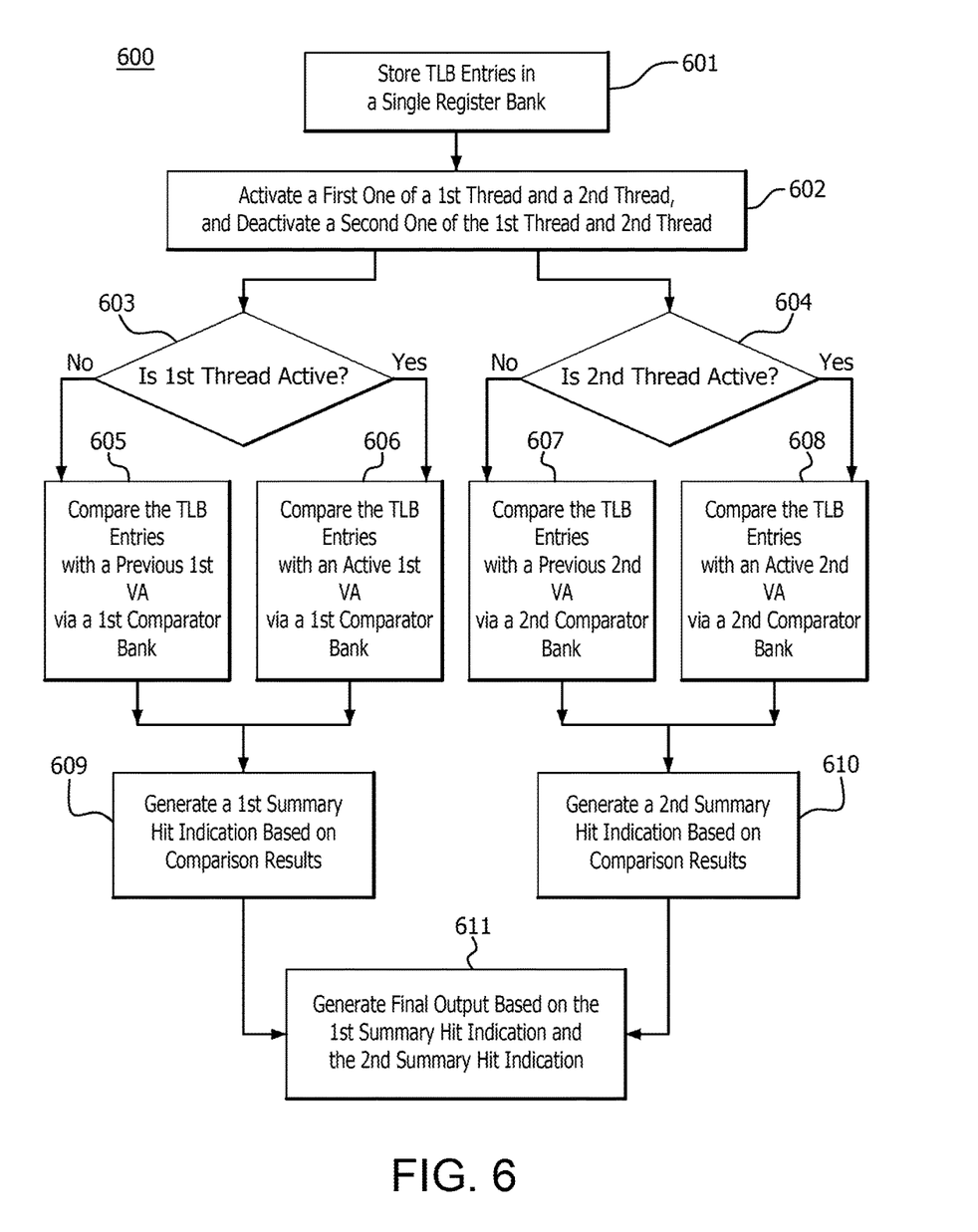
FIG. 6 is a flow diagram of a multithread CAM method according to one or more embodiments.

FIG. 6 is a flow diagram of a multithread CAM method 600 according to one or more embodiments. While the flow diagram depicts a series of sequential operations, unless explicitly stated, no inference should be drawn from that sequence regarding specific order of performance, performance of operations or portions thereof serially rather than concurrently or in an overlapping manner, or performance of the operations depicted exclusively without the occurrence of intervening or intermediate operations. The process depicted in the example is implemented by, for example, memory management hardware described above.

The multithread CAM method 600 includes storing TLB entries in a single register bank (operation 601) and selectively activating/deactivating a first thread and a second thread such that one is active and the other is inactive (operation 602). The method 600 further includes determining whether the first thread is active (operation 603) and determining whether the second thread is active (operation 604). It will be appreciated that a timing of performing operations 603 and 604, and the respective operations that follow, includes performing the operations simultaneously, overlapping to at least some degree, non-overlapping, or ahead of or behind the other. If the first thread is inactive, a first register bank compares the TLB entries with a previous first virtual address (VA) (operation 605), and, if the first thread is active, the first register bank compares the TLB entries with an active first VA (operation 606). Similarly, if the second thread is inactive, a second register bank compares the TLB entries with a previous second virtual address (VA) (operation 607), and, if the second thread is active, the second register bank compares the TLB entries with an active second VA (operation 608). The first and the second comparator banks are independent from each other and are both fully-associative with the single register bank. Thus, there are redundant comparator banks dedicated to each thread for comparing a virtual address provided on the corresponding thread to a single set of TLB entries. Furthermore, the input virtual address to each comparator bank retains its previous value via address capture when its thread is inactive.

The method 600 further includes generating a first summary hit indication based on the comparison results of the first comparator bank (operation 609) and generating a second summary hit indication based on the comparison results of the second comparator bank (operation 610). A final output (e.g., a "hit" or "miss") is generated based on the first and the second summary hit indication (operation 611). In particular, the final output is generated for a thread that is active and valid based on the first or second summary hit indication that corresponds to the active and valid thread. The comparison results (and hit summary indication) of the inactive or invalid thread are disregarded.

A multi-thread CAM device is disclosed herein. The multi-thread CAM device includes a first input configured to receive a first virtual address corresponding to a first thread, a second input configured to receive a second virtual address corresponding to a second thread, a register bank including a plurality of registers each configured to store a binary word mapped to one of a plurality of physical addresses, a first comparator bank, and a second comparator bank. The first comparator bank includes a first plurality of comparators each coupled to one of the plurality of registers in a fully-associative configuration such that each of the first plurality of comparators is configured to receive the first virtual address while the first thread is active and valid, and receive a previous first virtual address while the first thread is inactive or invalid. The second comparator bank includes a second plurality of comparators each coupled to one of the plurality of registers in the fully-associative configuration such that each of the second plurality of comparators is configured to receive the second virtual address while the second thread is active and valid, and receive a previous second virtual address while the second thread is inactive or invalid. The previous first virtual address is the first virtual address received by the first input a last time the first thread was active and valid, and the previous second virtual address is the second virtual address received by the second input a last time the second thread was active and valid.

In some examples, the first comparator bank is separated from the second comparator bank and is identical to the second comparator bank.

In some examples each of the first plurality of comparators is configured to maintain a first input state corresponding to the previous first virtual address input to the first comparator bank while the first thread is inactive or invalid, and each of the second plurality of comparators is configured to maintain a second input state corresponding to the previous second virtual address input to the second comparator bank while the second thread is inactive or invalid.

In some examples, each of the first plurality of comparators is configured to compare one of the first virtual address and the previous first virtual address, based on an active state of the first thread, to a binary word stored in a register associated therewith for determining whether a first match is present, and the first comparator bank is configured to output first comparison results of the first plurality of comparators, and each of the second plurality of comparators is configured to compare one of the second virtual address and the previous second virtual address, based on an active state of the second thread, to the binary word stored in the register associated therewith for determining whether a second match is present, and the second comparator bank is configured to output second comparison results of the second plurality of comparators.

In some examples, the multi-thread CAM device includes a first logic component coupled to a first plurality of matchlines of the first comparator bank, and a second logic component coupled to a second plurality of matchlines of the second comparator bank. The first logic component is configured to output a first summary hit indication based on the first comparison results received on the first plurality of matchlines, and the second logic component is configured to output a second summary hit indication based on the second comparison results received on the second plurality of matchlines.

In some examples, the first summary hit indication indicates the first match is present on a condition that at least one of the first plurality of comparators matches the first virtual address to the binary word stored in the register associated therewith, and the second summary hit indication indicates the second match is present on a condition that at least one of the second plurality of comparators matches the second virtual address to the binary word stored in the register associated therewith.

In some examples, the multi-thread CAM device includes a logic circuit configured to receive the first summary hit indication and the second summary hit indication, and output a final result. Accordingly, one of the first thread and the second thread is active at a time, and the final result is the first summary hit indication on a condition that the first thread is active and the final result is the second summary hit indication on a condition that the second thread is active.

In some examples, the first comparator bank is configured to output the first comparison results based on the first plurality of comparators determining whether at least one first match is present, and the second comparator bank is configured to output the second comparison results based on the second plurality of comparators determining whether at least one second match is present.

In some examples, the multi-thread CAM includes a logic circuit configured to receive a first summary hit indication based on the first comparison results of the first plurality of comparators, receive a second summary hit indication based on the second comparison results of the second plurality of comparators, and output a final result. Accordingly, one of the first thread and the second thread is active at a time, and the final result is the first summary hit indication on a condition that the first thread is active and the final result is the second summary hit indication on a condition that the second thread is active.

In some examples, the previous first virtual address is the first virtual address provided by a first address register the last time the first thread was active and valid, and the previous second virtual address is the second virtual address provided by a second address register the last time the second thread was active and valid.

In some examples, each of the first plurality of comparators receive the first virtual address from a first address register on a condition that the first thread is active and valid, and each of the second plurality of comparators receive the second virtual address from a second address register on a condition that the second thread is active and valid.

In some examples, the multi-thread CAM device includes a first address register configured to send the first virtual address to the first comparator bank on a condition that the first thread is active and valid, and a second address register configured to send the second virtual address to the second comparator bank on a condition that the second thread is active and valid.

In some examples, the multi-thread CAM device includes a first address register and a second address register. The first address register is configured to store the first virtual address, and the first comparator bank is configured to receive the first virtual address from the first address register on a condition that the first thread is active and valid. The second address register configured to store the second virtual address, and the second comparator bank is configured to receive the second virtual address from the second address register on a condition that the second thread is active and valid.

In some examples, the multi-thread CAM device includes a first address capture circuit and a second address capture circuit. The first address capture circuit is configured to store the first virtual address as the previous first virtual address, and the first comparator bank is configured to receive the previous first virtual address from the first address capture circuit on a condition that the first thread is inactive or invalid. The second address capture circuit is configured to store the second virtual address as the previous first virtual address, and the second comparator bank is configured to receive the previous second virtual address from the second address capture circuit on a condition that the second thread is inactive or invalid.

In some examples, the previous first virtual address is the first virtual address provided by a first address register to the first address capture circuit the last time the first thread was active and valid, and the previous second virtual address is the second virtual address provided by a second address register to the second address capture circuit the last time the second thread was active and valid.

In some examples, the multi-thread CAM device is an instruction translation lookaside buffer CAM.

A multi-thread CAM method is provided. A first virtual address corresponding to a first thread is received by a first comparator bank. The first comparator bank includes a first plurality of comparators each coupled to one of a plurality of registers of a register bank in a fully-associative configuration, and the first virtual address is received while the first thread is active and valid. A second virtual address corresponding to a second thread is received by a second comparator bank. The second comparator bank includes a second plurality of comparators each coupled to one of the plurality of registers of the register bank in the fully-associative configuration, and the second virtual address is received while the second thread is active and valid. A previous first virtual address corresponding to the first thread is received by the first comparator bank while the first thread is inactive or invalid. A previous second virtual address corresponding to the second thread is received by the second comparator bank while the second thread is inactive or invalid. The previous first virtual address is the first virtual address received a last time the first thread was active and valid, and the previous second virtual address is the second virtual address received a last time the second thread was active and valid.

In some example, a first input state corresponding to the previous first virtual address input to the first comparator bank is maintained by each of the first plurality of comparators on a condition that the first thread is inactive or invalid. In addition, A second input state corresponding to the previous second virtual address input to the second comparator bank is maintained by each of the second plurality of comparators on a condition that the second thread is inactive or invalid.

In some examples, one of the first virtual address and the previous first virtual address, based on an active state of the first thread, is compared by each of the first plurality of comparators to a binary word stored in a register associated therewith for determining whether a first match is present. First comparison results from the first plurality of comparators are output by the first comparator bank. One of the second virtual address and the previous second virtual address, based on an active state of the second thread, is compared by each of the second plurality of comparators to the binary word stored in the register associated therewith for determining whether a second match is present. Second comparison results from the second plurality of comparators are output by the second comparator bank.

In some examples, a first summary hit indication is generated by a first logic component based on the first comparison results. The first summary hit indication indicates the first match is present on a condition that at least one of the first plurality of comparators matches the first virtual address to the binary word stored in the register associated therewith. A second summary hit indication is generated by a second logic component based on the second comparison results. The second summary hit indication indicates the second match is present on a condition that at least one of the second plurality of comparators matches the second virtual address to the binary word stored in the register associated therewith.

In some examples, the first summary hit indication and the second summary hit indication are received by a logic circuit, and a final result is generated by the logic circuit based on the first summary hit indication and the second summary hit indication such that one of the first thread and the second thread is active at a time, and the final result is the first summary hit indication on a condition that the first thread is active and the final result is the second summary hit indication on a condition that the second thread is active.

In some examples, the first virtual address is received by the first comparator bank from a first address register on a condition that the first thread is active and valid. The second virtual address is received by the second comparator bank from a second address register on a condition that the second thread is active and valid.

In some examples, a first one of the first thread and the second thread is selectively activated by a processor, and a second one of the first thread and the second thread is selectively deactivated by the processor. The previous first virtual address is received by the first comparator bank from a first address capture circuit on a condition that the first thread is inactive or invalid such that the previous first virtual address is the first virtual address received the last time the first thread was active and valid. The previous first virtual address is received by the second comparator bank from a second address capture circuit on a condition that the second thread is inactive or invalid such that the previous second virtual address is the second virtual address received the last time the second thread was active and valid.

In some examples, the first virtual address is received by the first comparator bank from a first address register on a condition that the first thread is active and valid, and the second virtual address is received by the second comparator bank from a second address register on a condition that the second thread is active and valid.

It should be understood that many variations are possible based on the disclosure herein. Although features and elements are described above in particular combinations, each feature or element can be used alone without the other features and elements or in various combinations with or without other features and elements.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps can be executed by (or using) a hardware apparatus, like for example, a microprocessor, a programmable computer or an electronic circuit. In some embodiments, some one or more of the method steps can be executed by such an apparatus.

With regard to the various functions performed by the components or structures described above (assemblies, devices, circuits, systems, etc.), the terms (including a reference to a "means") used to describe such components are intended to correspond, unless otherwise indicated, to any component or structure that performs the specified function of the described component (i.e., that is functionally equivalent), even if not structurally equivalent to the disclosed structure that performs the function in the exemplary implementations of the invention illustrated herein.

The methods provided can be implemented in a general purpose computer, a processor, or a processor core. Suitable processors include, by way of example, a general purpose processor, a special purpose processor, a conventional processor, a digital signal processor (DSP), a plurality of microprocessors, one or more microprocessors in association with a DSP core, a controller, a microcontroller, Application Specific Integrated Circuits (ASICs), Field Programmable Gate Arrays (FPGAs) circuits, any other type of integrated circuit (IC), and/or a state machine. Such processors can be manufactured by configuring a manufacturing process using the results of processed hardware description language (HDL) instructions and other intermediary data including netlists (such instructions capable of being stored on a computer readable media). The results of such processing can be maskworks that are then used in a semiconductor manufacturing process to manufacture a processor which implements aspects of the embodiments.

The methods or flow charts provided herein can be implemented in a computer program, software, or firmware incorporated in a non-transitory computer-readable storage medium for execution by a general purpose computer or a processor. Examples of non-transitory computer-readable storage mediums include a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A multi-thread content-addressable memory (CAM) device comprising:
   a first input configured to receive a first virtual address corresponding to a first thread;
   a second input configured to receive a second virtual address corresponding to a second thread;
   a register bank including a plurality of registers each configured to store a binary word mapped to one of a plurality of physical addresses;
   a first comparator bank including a first plurality of comparators each coupled to one of the plurality of registers in a fully-associative configuration, wherein each of the first plurality of comparators is configured to compare the first virtual address to a binary word stored in a register associated therewith for determining whether a first match is present; and
   a second comparator bank including a second plurality of comparators each coupled to one of the plurality of registers in a fully-associative configuration, wherein each of the second plurality of comparators is configured to compare the second virtual address to a binary word stored in a register associated therewith for determining whether a second match is present.

2. The multi-thread CAM device of claim 1, further comprising:
   a logic circuit configured to receive a first summary hit indication indicating whether the first match is present at the first comparator bank, to receive a second summary hit indication indicating whether the second match is present at the second comparator bank, and to output a final result,
   wherein one of the first thread and the second thread is active at a time, and the final result is the first summary hit indication on a condition that the first thread is active and the final result is the second summary hit indication on a condition that the second thread is active.

3. The multi-thread CAM device of claim 1, wherein:
   each of the first plurality of comparators is configured to receive the first virtual address while the first thread is active and valid, and receive a previous first virtual address while the first thread is inactive or invalid, wherein the previous first virtual address is a first virtual address received by the first input a last time the first thread was active and valid, and
   each of the second plurality of comparators is configured to receive the second virtual address while the second thread is active and valid, and receive a previous second virtual address while the second thread is inactive or invalid, wherein the previous second virtual address is a second virtual address received by the second input a last time the second thread was active and valid.

4. The multi-thread CAM device of claim 1, further comprising:
   a first address register configured to store the first virtual address, and the first comparator bank is configured to receive the first virtual address from the first address register on a condition that the first thread is active and valid; and
   a second address register configured to store the second virtual address, and the second comparator bank is configured to receive the second virtual address from the second address register on a condition that the second thread is active and valid.

5. The multi-thread CAM device of claim 1, further comprising:
   a first address capture circuit configured to store the first virtual address, and the first comparator bank is configured to receive the first virtual address from the first address capture circuit on a condition that the first thread is inactive or invalid; and
   a second address capture circuit configured to store the second virtual address, and the second comparator bank is configured to receive the second virtual address from the second address capture circuit on a condition that the second thread is inactive or invalid.

6. The multi-thread CAM device of claim 5, wherein:
   the first virtual address is a virtual address provided to the first address capture circuit a last time the first thread was active and valid, and
   the second virtual address is a virtual address provided to the second address capture circuit a last time the second thread was active and valid.

7. The multi-thread CAM device of claim 1, further comprising:
   a first logic component coupled to a plurality of matchlines of the first comparator bank, wherein the first logic component is configured to output a first summary hit indication based on comparison results of the first plurality of comparators; and
   a second logic component coupled to a plurality of matchlines of the second comparator bank, wherein the second logic component is configured to output a second summary hit indication based on comparison results of the second plurality of comparators.

8. The multi-thread CAM device of claim 7, wherein:
   the first summary hit indication indicates the first match on a condition that at least one of the first plurality of comparators matches the first virtual address to the binary word stored in the associated register associated thereto, and
   the second summary hit indication indicates the second match on a condition that at least one of the second plurality of comparators matches the second virtual address to the binary word stored in the associated register associated thereto.

9. The multi-thread CAM device of claim 1, wherein:
   each of the first plurality of comparators retains an input state corresponding to a previous first virtual address provided to the first comparator bank on a condition that the first thread is inactive or invalid, the previous first virtual address is a first virtual address received by the first input a last time the first thread was active and valid, and
   each of the second plurality of comparators retain an input state corresponding to a previous second virtual address provided to the second comparator bank on a condition that the second thread is inactive or invalid, the previous second virtual address is a second virtual address received by the second input a last time the second thread was active and valid.

10. The multi-thread CAM device of claim 9, wherein:
   each of the first plurality of comparators is configured to receive the first virtual address on a condition that the first thread is active and valid, and
   each of the second plurality of comparators is configured receive the second virtual address on a condition that the second thread is active and valid.

11. The multi-thread CAM device of claim 1, wherein the first comparator bank is separated from the second comparator bank and is identical to the second comparator bank.

12. The multi-thread CAM device of claim 1, wherein the multi-thread CAM device is an instruction translation lookaside buffer CAM.

13. A multi-thread content-addressable memory (CAM) method, comprising:
   receiving, by a first comparator bank, a first virtual address corresponding to a first thread, wherein the first comparator bank includes a first plurality of comparators each coupled to one of a plurality registers in a fully-associative configuration;
   receiving, by a second comparator bank, a second virtual address corresponding to a second thread, wherein the second comparator bank includes a second plurality of comparators each coupled to one of the plurality of registers in a fully-associative configuration;
   comparing, by each of the first plurality of comparators, the first virtual address to a binary word stored in a register associated therewith for determining whether a first match is present; and
   comparing, by each of the second plurality of comparators, the second virtual address to a binary word stored in a register associated therewith for determining whether a second match is present.

14. The multi-thread CAM method of claim 13, further comprising:
   generating a final result based on whether the first match is present at the first comparator bank or whether the second match is present at the second comparator bank, wherein one of the first thread and the second thread is active at a time, and the final result corresponds to whether the first match is present on a condition that the first thread is active and the final result corresponds to whether the second match is present on a condition that the second thread is active; and
   outputting the final result.

15. The multi-thread CAM method of claim 13, further comprising:
   receiving, by the first comparator bank, the first virtual address while the first thread is active and valid, and a previous first virtual address while the first thread is inactive or invalid, wherein the previous first virtual address is a first virtual address received by the first input a last time the first thread was active and valid, and
   receiving, by the second comparator bank, the second virtual address while the second thread is active and valid, and a previous second virtual address while the second thread is inactive or invalid, wherein the previous second virtual address is a second virtual address received by the second input a last time the second thread was active and valid.

16. The multi-thread CAM method of claim 15, wherein:
   the first virtual address is received from a first address register on a condition that the first thread is active and valid; and
   the second virtual address is received from a second address register on a condition that the second thread is active and valid.

17. The multi-thread CAM method of claim 16, wherein:
   the previous first virtual address is received from a first address capture circuit on a condition that the first thread is inactive or invalid; and
   the previous second virtual address is received from a second address capture circuit on a condition that the second thread is inactive or invalid.

18. The multi-thread CAM method of claim 13, further comprising:
   generating, by a first logic component, a first summary hit indication based on comparison results of the first plurality of comparators, the first summary hit indication indicating the first match on a condition that at least one of the first plurality of comparators matches the first virtual address to the binary word stored in the associated register associated thereto; and
   generating, by a second logic component, a second summary hit indication based on comparison results of the second plurality of comparators, the second summary hit indication indicating the second match on a condition that at least one of the second plurality of comparators matches the second virtual address to the binary word stored in the associated register associated thereto.

19. The multi-thread CAM method of claim 13, further comprising:
   retaining, by each of the first plurality of comparators, an input state corresponding to a previous first virtual address provided to the first comparator bank on a condition that the first thread is inactive or invalid, the previous first virtual address is a first virtual address received by the first comparator bank a last time the first thread was active and valid; and
   retaining, by each of the second plurality of comparators, an input state corresponding to a previous second virtual address provided to the second comparator bank on a condition that the second thread is inactive or invalid, the previous second virtual address is a second virtual address received by the second comparator bank a last time the second thread was active and valid.

20. The multi-thread CAM method of claim 19, further comprising:
   receiving, by each of the first plurality of comparators, the first virtual address on a condition that the first thread is active and valid; and
   receiving, by each of the second plurality of comparators, the second virtual address on a condition that the second thread is active and valid.

* * * * *